United States Patent [19]
Corwith

[11] Patent Number: 6,037,787
[45] Date of Patent: Mar. 14, 2000

[54] HIGH PERFORMANCE PROBE INTERFACE FOR AUTOMATIC TEST EQUIPMENT

[75] Inventor: Arthur E. Corwith, Medford, Oreg.

[73] Assignee: Teradyne, Inc., Boston, Mass.

[21] Appl. No.: 09/047,089

[22] Filed: Mar. 24, 1998

[51] Int. Cl.[7] .................................................. G01R 31/02
[52] U.S. Cl. ........................................... 324/754; 324/761
[58] Field of Search .................................... 324/754–758, 324/761

[56] References Cited

U.S. PATENT DOCUMENTS

| | | | |
|---|---|---|---|
| 4,138,643 | 2/1979 | Beck et al. ................................ | 324/754 |
| 4,574,236 | 3/1986 | Hechtman ................................ | 324/754 |
| 4,740,746 | 4/1988 | Pollock et al. ........................... | 324/761 |
| 4,812,745 | 3/1989 | Kern ...................................... | 324/158 P |
| 5,068,602 | 11/1991 | Mielke ................................. | 324/158 F |
| 5,116,244 | 5/1992 | Cartier ..................................... | 439/578 |

FOREIGN PATENT DOCUMENTS

| | | |
|---|---|---|
| 0 177 809 | 4/1986 | European Pat. Off. . |
| 0 317 191 | 5/1989 | European Pat. Off. . |
| 06003371 | 1/1994 | Japan . |

*Primary Examiner*—Diep N. Do
*Assistant Examiner*—Russell M. Kobert
*Attorney, Agent, or Firm*—Teradyne Legal Department

[57] ABSTRACT

A probe interface device is disclosed that includes a plurality of coaxial contact probe assemblies disposed in an insulative base. Each coaxial contact probe assembly includes a solid tubular shield with a coaxial signal contact probe, which is isolated from the shield by an insulative retainer; and, a solid tubular reference with another coaxial contact probe. The shield and the reference are soldered together at their respective ends. Further, the insulative base includes an upper retainer and a lower retainer attached to a hollow frame. The upper and lower retainers are provided with the same number of holes for engaging a plurality of coaxial contact probe assemblies. The probe interface device can be used for testing mixed-signal devices and is easy to manufacture.

20 Claims, 5 Drawing Sheets

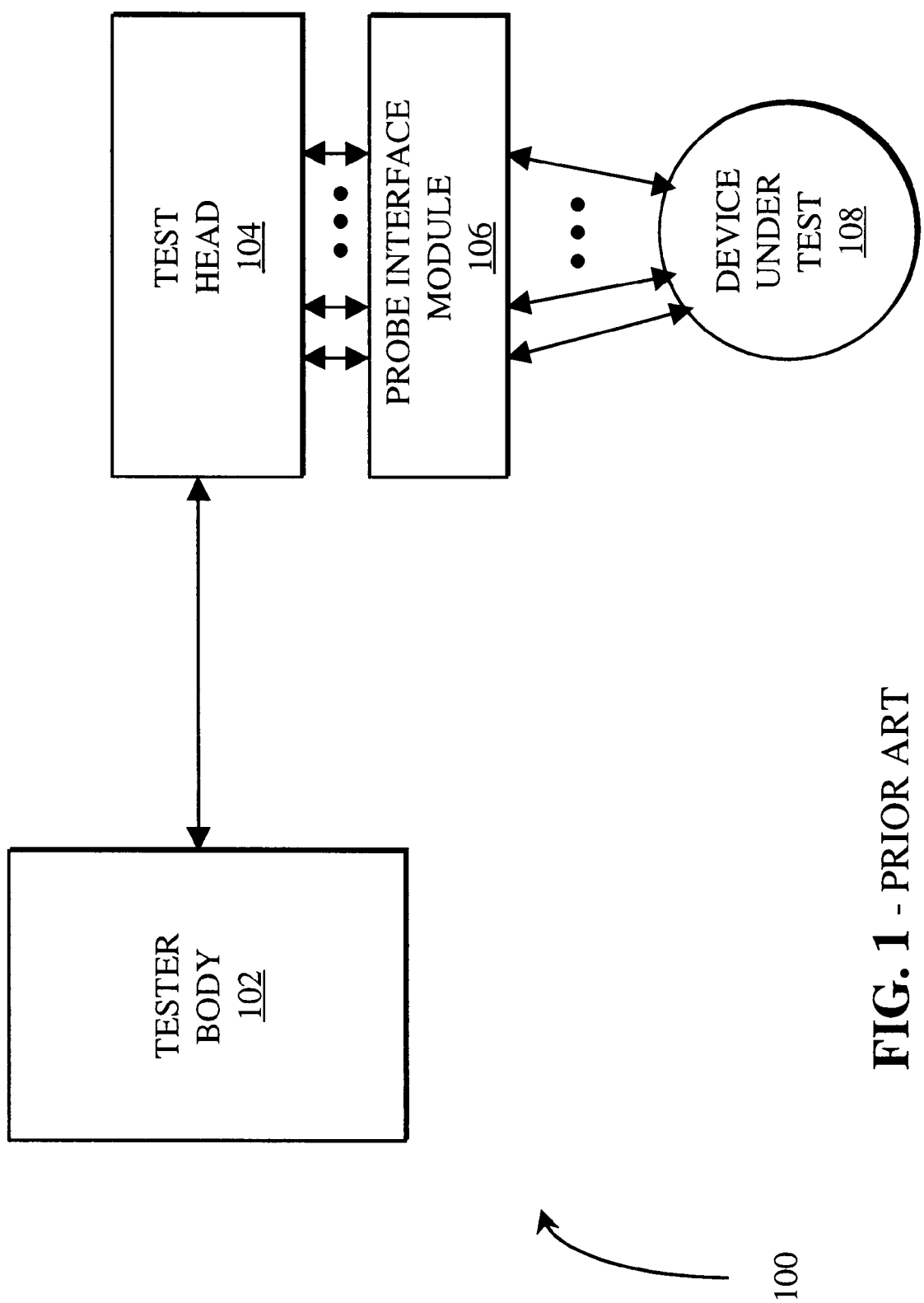
FIG. 1 - PRIOR ART

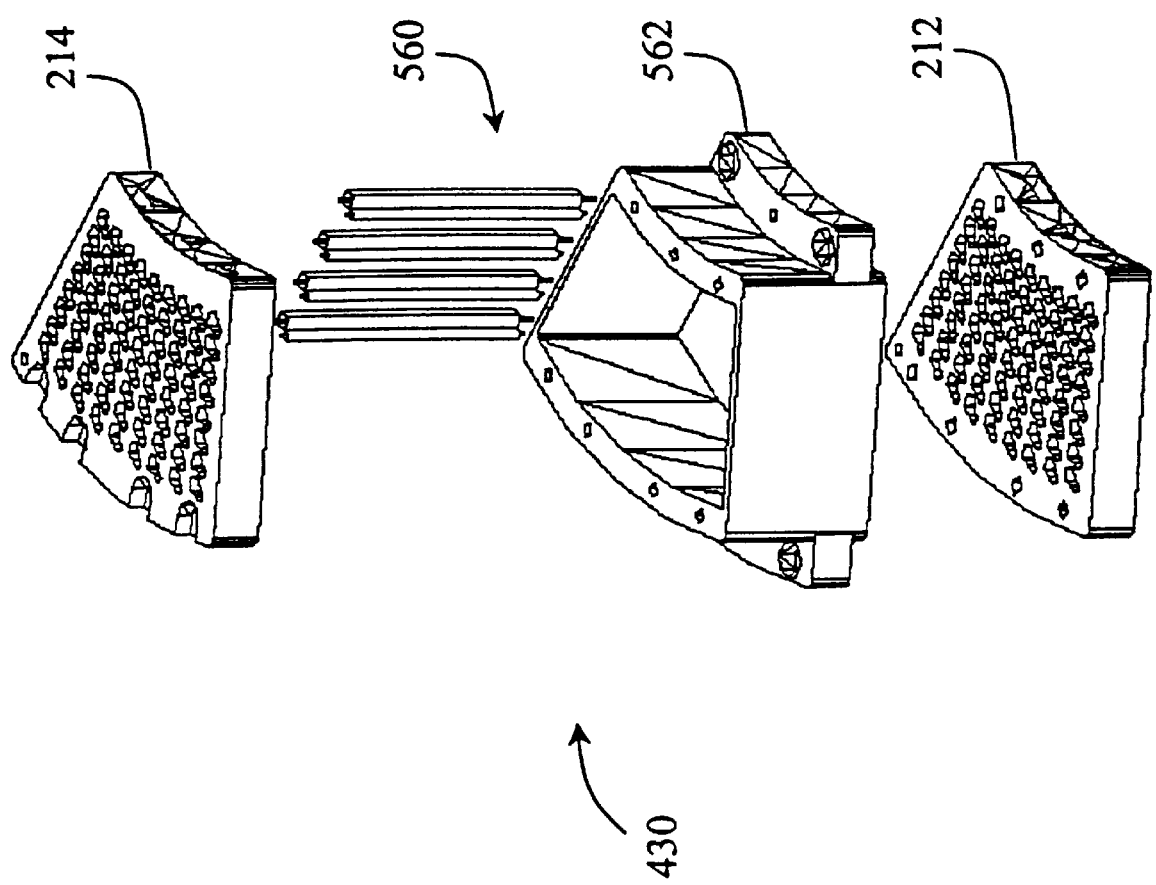

HIGH PERFORMANCE PROBE INTERFACE FOR AUTOMATIC TEST EQUIPMENT

This invention relates generally to automatic test equipment and more particularly to probe interface hardware used in automatic test equipment.

Automatic test equipment, also known as a tester, is commonly used to determine whether semiconductor devices contain manufacturing defects. As shown in FIG. 1, a tester 100 generally includes a tester body 102 that houses computerized control and data acquisition circuitry (not shown), a test head 104 with numerous driver and receiver channels (not shown), and interface hardware such as a probe interface module 106 that includes numerous electrical contact probes (not shown). Each contact probe in the probe interface module 106 typically provides electrical contact between one of the channels in the test head 104 and an electrical node (not shown) of a device under test 108. Further, each channel in the test head 104 is typically coupled to the control and data acquisition circuitry in the tester body 102.

Whereas early semiconductor devices typically included either digital logic or simple analog circuitry, today's devices frequently include both digital and analog circuitry. Such devices are commonly known as mixed-signal devices and the testers that test them are commonly known as mixed-signal testers. These mixed-signal devices often carry analog signals that not only have low signal levels but also very high frequencies. These devices also typically carry digital signals with very high data rates. Further, the densities of these devices have generally increased with successive generations of the devices.

As a result, it has become increasingly important that the interface hardware between the tester circuitry and the device under test produce a high level of signal integrity. This generally means that the interface hardware must have a precisely controlled impedance and very good leakage characteristics.

One method of improving signal integrity in the interface hardware of a tester includes providing coaxial shielding around the contact probes. This method is described in US Pat. No. 4,724,180, issued Feb. 9, 1998, which is assigned to the same assignee as the present invention. In particular, two tubular holes are provided in the interface for each contact probe. The walls of both holes are coated with metal, and the metal coatings of the holes are electrically connected. One of the holes is large enough to receive a dielectric insert, which also has a hole in it. A signal contact probe is inserted into the hole in the dielectric, which insulates the signal contact probe from the metal coating in the larger hole. A ground contact probe is also inserted into the smaller hole. This probe makes electrical contact with the metal coating in the smaller hole. As a result, when the ground contact probe is connected to ground the metal coatings in both the larger and the smaller holes are brought to ground potential. The grounded metal coating in the larger hole acts as a coaxial shield for signals carried by the signal contact probe.

Although this method of providing coaxial shielding around electrical contact probes has been successfully used for improving signal integrity in the tester-to-device interface, we have recognized some drawbacks. For example, it is sometimes difficult to control the coverage and uniformity of the metal coatings in each pair of holes in the interface. This can result in flaws in the metal coatings, which may reduce the effectiveness of the coaxial shield for blocking interference between signal contact probes. This can also make it difficult to control the characteristic impedance of the contact probes.

We have also recognized that flaws in either the coaxial shields or the electrical connections between the holes for the signal and ground contact probes may add stray leakage and capacitance, thereby reducing the bandwidth of the signal contact probes and causing signal losses, especially for very high frequency signals. Further, the difficulty in controlling the coverage and uniformity of the metal coatings also tends to increase the manufacturing cost of the interface.

It would therefore be desirable to have a tester with a tester-to-device interface that can handle very high frequency analog and digital signals. Such an interface would have controllable impedance characteristics and very low leakage and capacitance. It would also be desirable to have a tester-to-device interface that is easy and inexpensive to manufacture.

SUMMARY OF THE INVENTION

With the foregoing background in mind, it is an object of the invention to provide a tester that can test high-speed, mixed-signal electronic circuitry.

It is another object of the invention to provide a tester with a tester-to-device that has a precisely controlled impedance.

It is still another object of the invention to provide a tester with a tester-to-device that has low leakage and low capacitance.

It is yet another object of the invention to provide a tester with a tester-to-device interface that is easy to manufacture.

The foregoing and other objects are achieved by providing a tester with a tester-to-device interface that includes a plurality of coaxial contact probe assemblies. Each probe assembly includes a tubular metal shield, a signal contact probe, and an annular insulative retainer. The signal contact probe is adapted to pass through and engage the annular insulative retainer, which is inserted into the tubular metal shield. Each probe assembly also includes a second metal tube and a second contact probe, which is adapted to pass through and engage the second metal tube. The tubular metal shield is connected to the second metal tube in a lengthwise fashion for providing good electrical contact between the two metal tubes.

In another embodiment, the tester-to-device interface includes at least one insulative retainer having a plurality of holes formed therein, each hole being adapted to receive and engage a coaxial contact probe assembly.

In still another embodiment, a signal contact probe is passed through and frictionally engaged with the hole of at least one annular insulative retainer. The probe/retainer assembly is then passed through and engaged with a tubular metal shield. Further, a second contact probe is passed through and engaged with a second metal tube. The tubular metal shield and the second metal tube are then connected at their ends to provide good electrical contact. An insulative base is formed and at least one hole is provided therein. Finally, the electrically connected tubes are passed through and engaged with the hole in the base.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1 is a simplified block diagram of a conventional tester;

FIG. 5 is an exploded view of the probe interface device in accordance with the present invention.

DESCRIPTION OF THE PREFERRED EMBODIMENT

Figure 4:
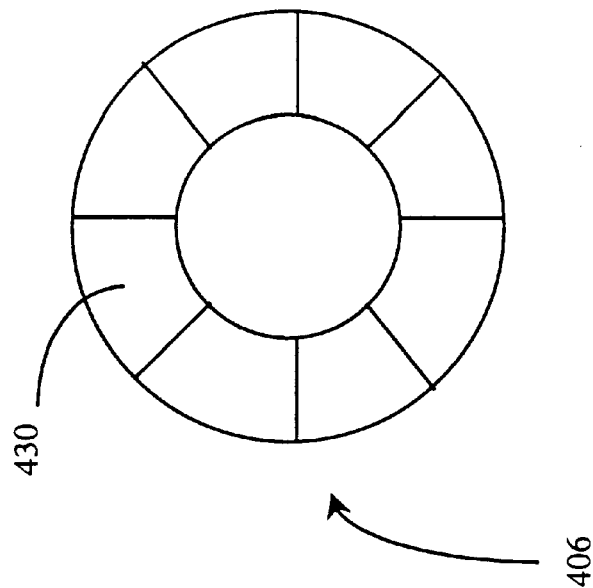
FIG. 4 is a plan view of an arrangement of probe interface devices.
Figure 2:
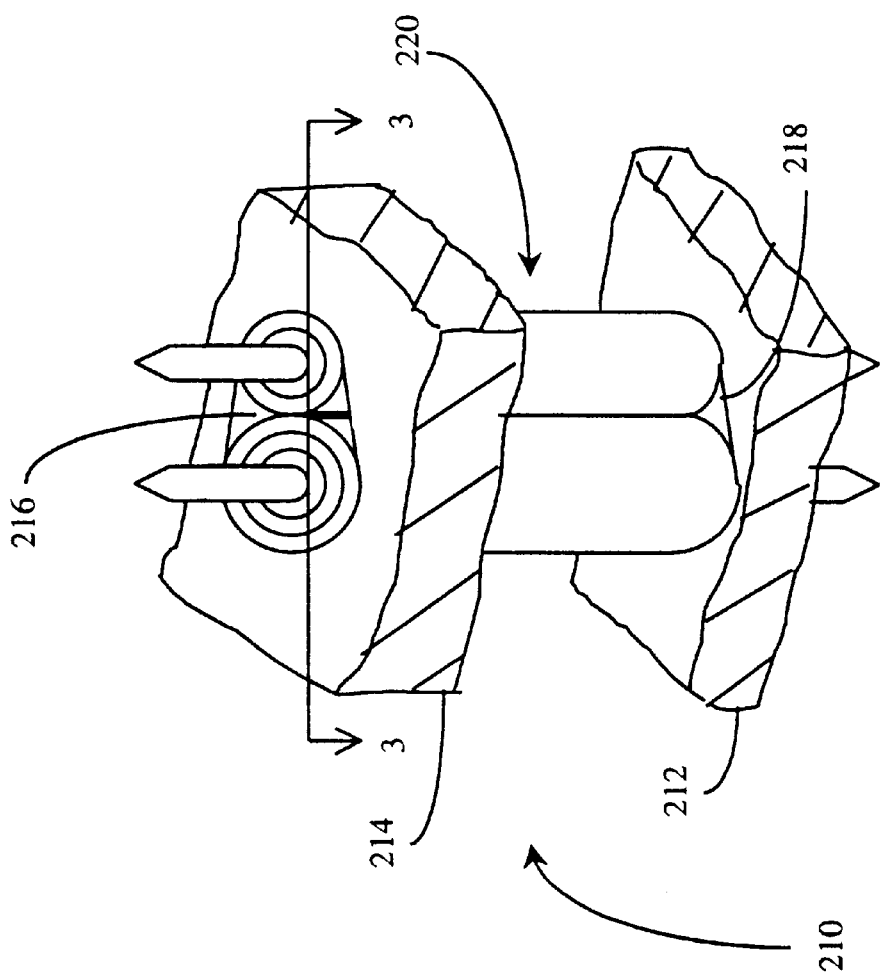
FIG. 2 is an isometric view of a portion of a probe interface device in accordance with the present invention.

FIG. 2 shows a portion 210 of a preferred embodiment of a probe interface device 430 (FIGS. 4 and 5). The probe interface portion 210 includes a coaxial contact probe assembly 220 and a pair of insulative retainers 212 and 214, which include a plurality of holes such as holes 216 and 218 that secure and hold the contact probe assembly 220 as shown.

Figure 3:
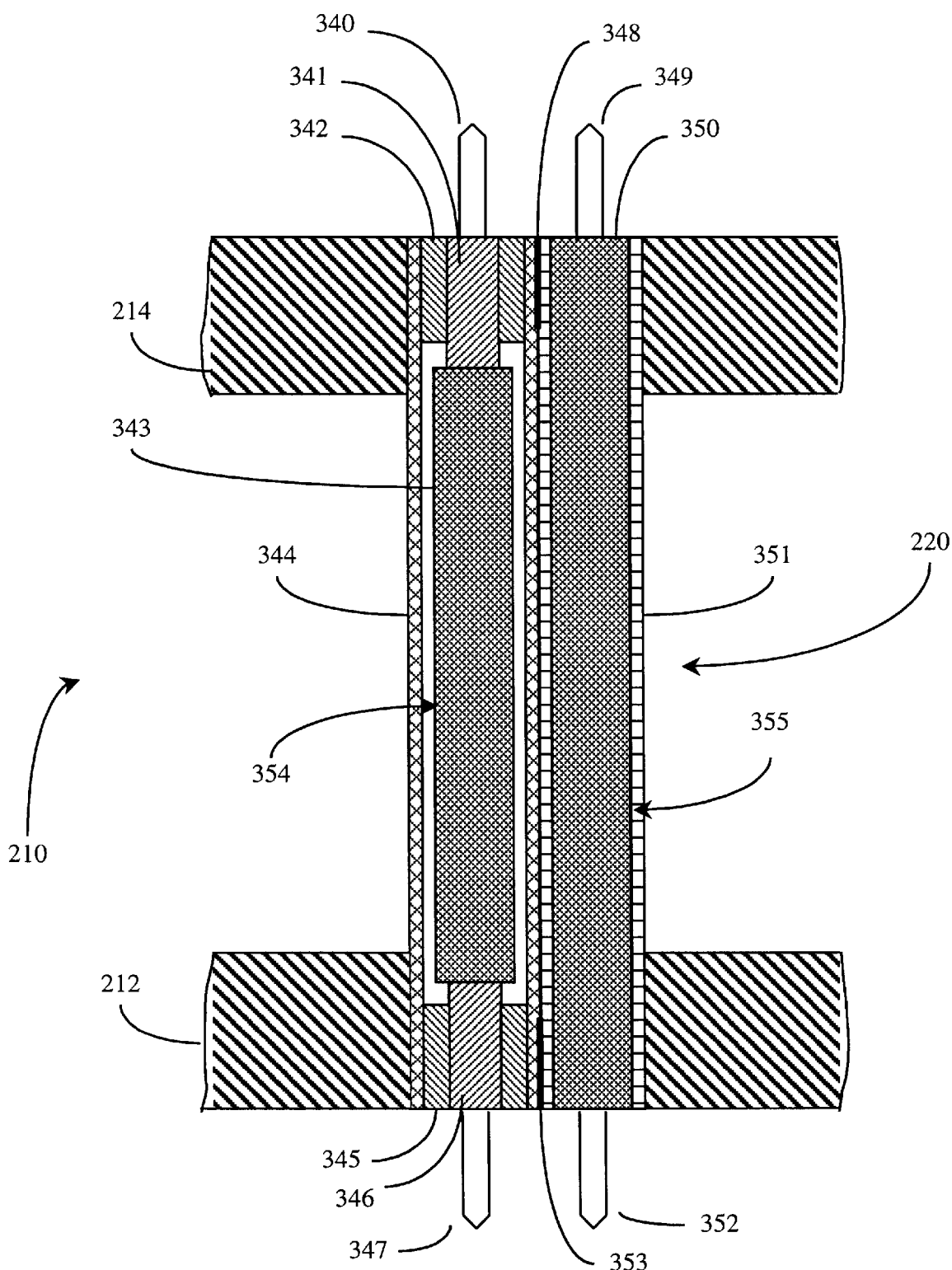
FIG. 3 is a cross-sectional view of the apparatus shown in FIG. 2.

FIG. 3 shows a detailed cross-sectional view of the probe interface portion 210. The contact probe assembly 220 includes a pair of metal tubes 344 and 351. In particular, the metal tube 344 is coaxial with a contact probe 354 that includes several barrel portions, for example, barrel portions 341, 343, and 346, and probes 340 and 347, which extend from opposite ends of the tube 344. In the preferred embodiment, two insulative annular retainers, for example, retainers 342 and 345, are used to center, secure, and hold the contact probe 354 in the tube 344. The retainers also electrically isolate the contact probe 354 from the tube 344. Accordingly, the metal tube 344 acts as a coaxial shield for the contact probe 354, which preferably carries signals between a tester and a semiconductor device under test.

Similarly, the metal tube 351 is coaxial with another contact probe 355 that includes a barrel 350 and probes 349 and 352, which extend from opposite ends of the tube 351. While the contact probe 354 in the tube 344 is isolated from the tube 344 by the insulative retainers 342 and 345, the contact probe 355 in the tube 351 makes good electrical contact with the tube 351. Further, both the probes 349 and 352 may make contact with ground potential during use. Accordingly, the metal tube 351 may act as a ground reference for the coaxial shield 344, which is preferably connected to the tube 351 by solder 348 and 353.

In the preferred embodiment, the barrel portions 341 and 346 have the same diameter, which is smaller than the diameter of the barrel portion 343. Further, the diameter of the barrel 343 is smaller than the inner diameter of the shield 344. As a result, the signal contact probe 354 is isolated from the shield 344. In contrast, the diameter of the barrel 350 is such that when the contact probe 355 is inserted into the tube 351, the contact probe 355 and the tube 351 make good electrical contact. Because the contact probe 355 is not isolated from the tube 351, the diameter of the tube 351 can be made smaller than the diameter of the shield 344.

Both the contact probes 354 and 355 are preferably spring-loaded contact probes. Accordingly, the probes 340 and 347 act as plungers and pass through the respective barrel portions 341 and 346 to make contact with a spring (not shown) in the barrel 343. The spring biases the probes 340 and 347 outwardly from the barrels 341 and 346.

Similarly, the probes 349 and 352 of the contact probe 355 act as plungers and pass through the barrel 350 to make contact with another spring (not shown) in the barrel 350. This spring also biases the probes 349 and 352 outwardly from the barrel 350. Further, the contact probes 354 and 355 are preferably the same length. This ensures even force distribution on both a device interface board (not shown) in the test head and the semiconductor device under test.

In the preferred embodiment, the insulative annular retainers 342 and 345 frictionally engage the barrel portions 341 and 346, respectively. The retainers 342 and 345 are preferably made of TEFLON™, however other suitable insulative materials may be used. Further, the diameter of the retainers 342 and 345 is slightly larger than the inner diameter of the shield 344. This allows the retainers 342 and 345 to be press-fit into the coaxial shield 344.

Both the shield 344 and the tube 351 may have the same length. Further, the shield 344 and the tube 351 are preferably made of copper, however other suitable conductive materials may be used.

The solder 348 and 353 are preferably used for electrically connecting the shield 344 and the tube 351. In the preferred embodiment, the solder 348 and 353 connect the shield tube 16 and the reference tube 18 at respective ends of the tubes as shown in FIG. 3. Because of considerations relating to electromagnetic fields, which are known to those skilled in this art, it is important that the tubes 344 and 351 make good electrical contact at the respective ends. This ensures optimal current flow between the tubes 344 and 351. In the preferred embodiment, the solder 348 and 353 extend to at least 0.015 inches from the respective ends of the tube 344 and the tube 351.

Clips (not shown) may also be used for securing the contact probe assembly 220 between the retainers 212 and 214. The clips may be made from either conductive or nonconductive material.

Holes 216 and 218 are provided in the insulative retainers 214 and 212, respectively. Each hole 216 and 218 is sized to secure and hold the shield 344 and tube 351 assembly as shown. Further, the insulative retainers 212 and 214 may be formed by injection molding.

FIG. 4 shows a simplified view of a probe interface module 406, consisting of eight identical probe interface devices 430, in a horizontal cross-section. Inner and outer walls of the retainers 212 and 214 are coaxially arcuate. Further, the eight probe interface devices 430 are abutted to form the annular probe interface module 406, which provides electrical contact between the test head and the device under test.

FIG. 5 shows an exploded view of the probe interface device 430. The same number of holes are provided in both the retainers 212 and 214 to engage a plurality of contact probe assemblies, four of which are shown generally at 560. After engaging the contact probe assemblies 560, the retainers 212 and 214 are attached to the bottom and top, respectively, of an open insulative frame 562 using screws, rivets, or other suitable fastening devices. The frame 562 may also be formed by injection molding. Further, the retainers 212 and 214 have approximately the same thickness; and, the sum of the thickness of the retainer 214, the depth of the frame 562, and the thickness of the retainer 212 is approximately equal to the length of the shield 344 and the tube 351.

In a typical tester configuration, each signal contact probe 354 in a corresponding shield 344 provides electrical contact between one of the channels in the test head and one of the nodes of the device under test. Further, each contact probe 355 in a corresponding tube 351 makes electrical contact to ground pads on the device interface board and the device under test. Because the shields 344 surrounding respective signal contact probes 354 make good electrical contact with corresponding tubes 351 through solder connections 348 and 353, the shields 344 provide good electrical shielding to the signal contact probes 354.

The electrical contact probe assembly 220 is made by inserting a signal contact probe 354 into a shield 344 such that the probes 340 and 347 extend from the shield 344. Next, each end of the signal contact probe 354 is passed through one of the two insulative retainers 342 and 345, which are then press-fit into the shield 344. A contact probe 355 is then inserted into a metal tube 351 such that the probes 349 and 352 extend from the tube 351. Next, the shield 344 is soldered or brazed to the tube 351 preferably at the solder locations 348 and 353.

The probe interface device 430 is then made by forming the insulative retainers 212 and 214 and the frame 562. Next, a suitable number of holes are provided in both the retainers 212 and 214. One end of a contact probe assembly 220 is then inserted into each hole of one of the retainers 212 and 214 such that a pair of probe ends 340 and 349, or 347 and 352, extends from each hole of the retainer. The contact probe assemblies 220 are then passed through the frame 562 and the opposite end of the assemblies 220 are inserted into the holes in the other retainer such that a pair of probe ends extends from each hole of that retainer. Finally, the retainers 212 and 214 are fastened to the frame 562. At least one clip is then used for securing each assembly 220 between the retainers 212 and 214.

It follows from the above description that the present invention offers several advantages over prior tester-to-device interfaces. For example, the solid copper shields 344 provide superior electrical shielding to the signal contact probes 354, thereby reducing signal noise and cross-talk. The dimensions of the shields 344 can also be precisely set for controlling the characteristic impedances of the contact probes 354 and 355, thereby minimizing signal reflection.

Also, the solid copper shields 344 may have an integral connection to ground potential through the solder connections 348 and 353, the tubes 351, and the contact probes 355. This improves both the integrity of the signals carried by the signal contact probes 354 and the bandwidth of the signal contact probes 354, and reduces signal loss.

For example, it is contemplated that the probe interface device 430 according to the present invention will provide a 3 dB-bandwidth of at least 5 GHz and have a return loss that is less than −20 dB at 1 GHz.

Also, the probe interface device 430 is especially useful in testers that test high-speed, mixed-signal electronic circuitry. As mentioned above, the shields 344 provide superior shielding to reduce noise and cross-talk, and control the impedance of contact probes to minimize signal reflections. This is important for making measurements involving high-speed digital signals such as those in the VHF or microwave frequency range.

The probe interface device 430 can also be used to make low-leakage measurements involving low-level, high-speed analog signals. For example, the probe assembly 220 can be configured to provide a separate driven guard for each signal contact probe 354. It is known to those skilled in this art that driven guards can be used to make such low-leakage measurements on analog signals.

In particular, instead of connecting each contact probe 355 to ground potential, each contact probe 355 may alternatively be driven to the same potential as its corresponding signal contact probe 354. This prevents any leakage current from flowing between the probes 354 and 355. It is contemplated that this configuration will make low-leakage measurements of current values on the order of femto-amperes. Accordingly, the same contact probe assembly 220 can be used to make measurements involving both high-speed digital signals and low-level analog signals.

Also, the solid copper shields 344 and the tubes 351 provide structural support to the contact probes 354 and 355, respectively. This means that the insulative retainers 212 or 214 need not extend along the entire length of the shields 344 and the tubes 351. This also means that thin retainers 212 and 214 and hollow frames 562 can be used to make the probe interface devices 430, thereby decreasing the overall weight and facilitating the manufacture of the probe interface module 406.

Also, because the shield 344 and the tube 351 are in direct contact, the contact probes 354 and 355 are spaced closer together as compared with prior designs. This not only improves signal integrity, but also increases the density of the contact probes in the probe interface device 430.

Having described one embodiment, numerous alternative embodiments or variations might be made. For example, it was described that the contact probes 354 and 355 in the contact probe assembly 220 are spring contact probes. However, this was merely an illustration. Any type of electrical contact probes may be used.

Also, it was described that two insulative retainers 342 and 345 are used to hold the signal contact probe 354 in the shield 344. However, this was also merely an illustration. One or more insulative retainers may be used to center, secure, and hold the signal contact probe 354 in the shield 344.

Also, it was described that a single contact probe 355 is inserted into the tube 351. However, this was merely an illustration. Two contact probes might alternatively be inserted into opposite ends of the tube 18. Both of these contact probes may then be connected to ground potential. Alternatively, both of these probes may be driven to the same potential as their corresponding signal contact probes 354 to provide a driven guard for low-leakage measurements.

Figure 6:
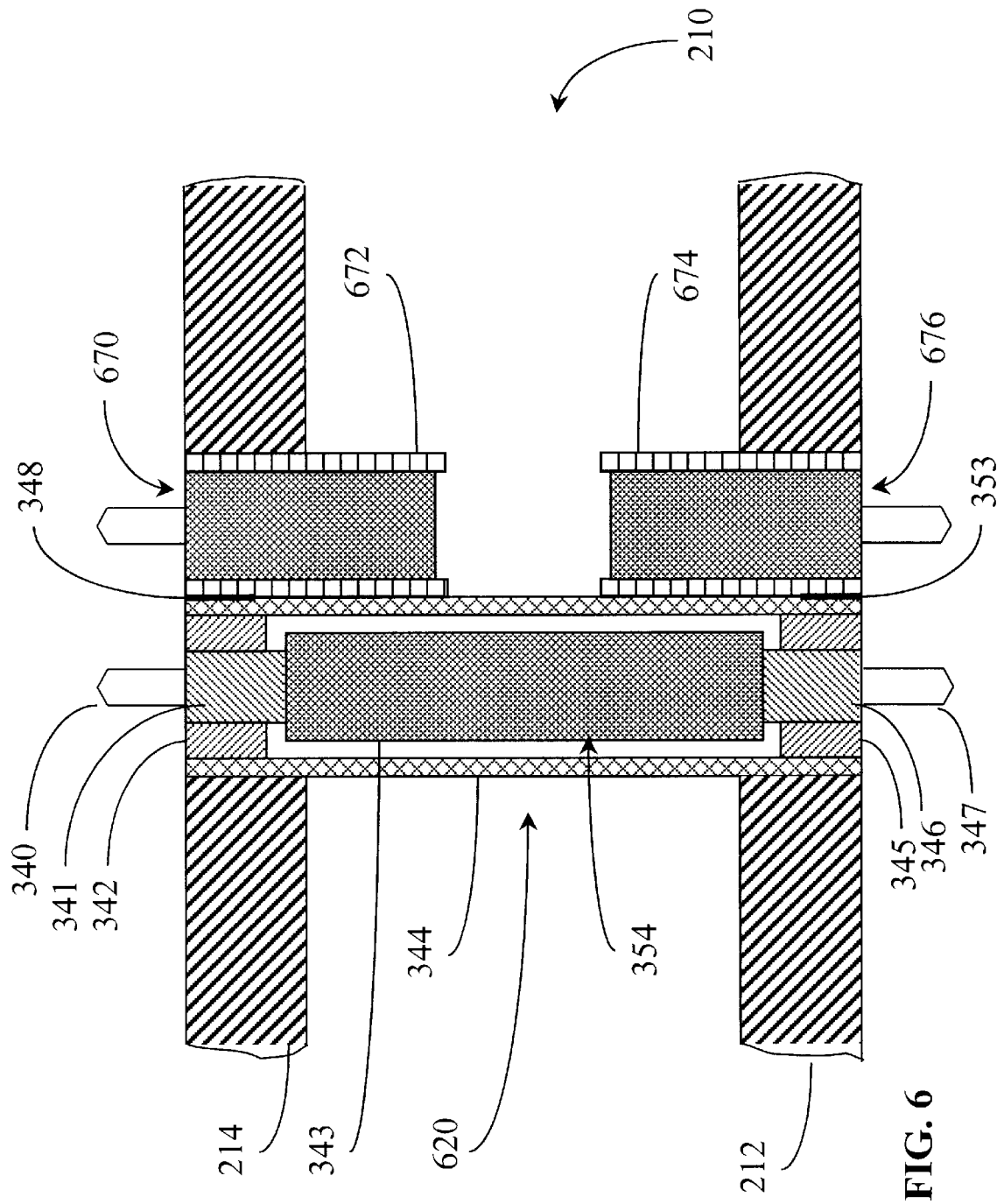
FIG. 6 is a cross-sectional view of an alternative embodiment of the FIG. 2 apparatus.

Also, it was described that the contact probe assembly 220 includes a single reference tube 351. However, this was also merely an illustration. As shown in FIG. 6, the contact probe assembly 220 may alternatively be configured with two reference tubes 672 and 674. Accordingly, a single-ended contact probe 670 is inserted into the tube 672, and another single-ended contact probe 676 is inserted into the tube 674. Both tubes 672 and 674 are then electrically connected to the shield 344 by solder at the locations 348 and 353, respectively. The lengths of the tubes 672 and 674 are primarily dictated by the lengths of their corresponding probes 670 and 676. It is contemplated that the configuration shown in FIG. 6 will provide the same performance as the configuration shown in FIG. 3. However, the FIG. 3 configuration generally facilitates assembly of the probe interface device 430.

Also, it was described that solder is used for electrically connecting the shield 344 and the reference tube 351. However, this was merely an illustration. Any other suitable material might be used for providing a good electrical connection between the shield 344 and the tube 351.

Also, it was described that the probe interface module 406 consists of eight identical probe interface devices 430. However this was also merely an illustration. The probe interface module 406 may include any number of probe interface devices 430.

Therefore, the invention should be limited only by the spirit and scope of the appended claims.

What is claimed is:

1. A probe interface for extending a tester interface from a tester to a device under test, comprising:

upper and lower insulative retainers oriented substantially in parallel and spaced a distance apart from each other, the insulative retainers each having a plurality of holes;

a plurality of contact probe assemblies each engaging one of the plurality of holes in the upper insulative retainer and one of the plurality of holes in the lower insulative retainer and spanning the distance between the retainers, each contact probe assembly including first rigid conductive tube extending from the upper insulative retainer to the lower insulative retainer;

a second rigid conductive tube oriented in parallel with the first conductive tube and electrically connected thereto; and first and second spring-loaded contact pins respectively passing through the first and second conductive tubes, for passing electrical signals between the tester and the device under test.

2. The probe interface of claim 1, wherein the second spring-loaded contact pin engages the second conductive tube and makes electrical contact with the second conductive tube.

3. The probe interface of claim 2, wherein the second spring-loaded contact pin is held in place within the second conductive tube by friction.

4. The probe interface of claim 2, wherein each of the plurality of contact probe assemblies further comprises:

first and second substantially annular insulators disposed within the first tubular conductor, the first insulator disposed near a first end of the first conductive tube and the second insulator disposed near a second end of the first conductive tube, wherein the first and second insulators retain the first contact probe within the first conductive tube and prevent an electrical connection therebetween.

5. The probe interface of claim 4, wherein:

the first spring-loaded probe is held in place within the first and second insulators by friction, and the first and second insulators are held in place within the first conductive tube by friction.

6. The probe interface of claim 5, wherein the first contact pin has an outer diameter that is smaller where the first contact pin engages the first and second insulators than it is between the first and second insulators.

7. The probe interface of claim 6, wherein the first and second conductive tubes are connected together by soldering.

8. The probe interface of claim 1, further comprising a frame that holds the first and second insulative retainers and maintains the distance between the first and second insulative retainers.

9. The probe interface of claim 8, wherein the upper and lower insulative retainers and the frame together with their contact probe assemblies form a first sector of a substantially round tester interface, and further comprising a plurality of other sectors substantially identical to the first sector.

10. The probe interface of claim 1, wherein the contact probe assemblies are separately assembled units that are inserted into the upper and lower retainers only after their assembly is complete.

11. The probe interface of claim 10, further comprising at least one clip that fastens the contact probe assemblies between the upper and lower retainers.

12. The probe interface of claim 1, wherein the first and second conductive tubes are electrically connected together at their respective first and second ends.

13. The probe interface of claim 1, wherein the first contact pin is coaxially retained within the first conductive tube to maintain a substantially constant characteristic impedance between the first contact pin and the first conductive tube.

14. A method of conveying electrical signals between a test system and a device under test, comprising:

(a) attaching first and second insulative retainers to a frame that holds the retainers in a parallel orientation a distance apart from each other, thereby leaving a space between the retainers;

(b) inserting each of a plurality of contact probe assemblies so that each passes through a hole in the first retainer, through the space between the first and second retainers, and through a hole in the second retainer, each of the plurality of contact probe assemblies thereby bridging the space between the retainers; and (c) fastening the plurality of contact probe assemblies between the first and second retainers;

wherein each of the plurality of contact probe assemblies includes a pair of rigid, conductive tubes that run parallel to each other and have a direct electrical connection between them, and wherein either of the steps of attaching (a) and inserting (b) may occur before the other.

15. The method of claim 14, wherein each of the plurality of contact probe assemblies further includes a first spring-loaded contact pin that passes through a first of the pair of tubes and is retained within the first tube by at least one annular insulator, the annular insulator maintaining a coaxial orientation between the first pin and the first tube and preventing a direct electrical connection therebetween.

16. The method of claim 15, wherein the at least one annular insulator is two annular insulators disposed at opposite ends of the first tube.

17. The method of claim 16, wherein the first spring-loaded contact pin has an outer diameter, and further comprising narrowing the outer diameter in regions of the contact pin near the two annular insulators.

18. The method of claim 15, wherein each of the plurality of contact probe assemblies further includes a second spring-loaded contact pin that passes through a second of the pair of tubes and is retained therein by friction, the second pin forming an electrical connection with the second tube.

19. The method of claim 14, further comprising repeating steps a-c to create a plurality of interface sectors.

20. The method of claim 14, wherein the step (c) of fastening includes applying at least one clip.

* * * * *